(12) United States Patent
Azizi et al.

(10) Patent No.: US 8,897,083 B1
(45) Date of Patent: Nov. 25, 2014

(54) MEMORY INTERFACE CIRCUITRY WITH DATA STROBE SIGNAL SHARING CAPABILITIES

(71) Applicant: Altera Corporation, San Jose, CA (US)

(72) Inventors: Navid Azizi, Markham (CA); Gordon Raymond Chiu, North York (CA)

(73) Assignee: Altera Corporation, San Jose, CA (US)

( * ) Notice: Subject to any disclaimer, the term of this patent is extended or adjusted under 35 U.S.C. 154(b) by 33 days.

(21) Appl. No.: 13/715,484

(22) Filed: Dec. 14, 2012

(51) Int. Cl.
*G11C 7/22* (2006.01)
*G11C 7/10* (2006.01)

(52) U.S. Cl.
CPC .................................. *G11C 7/10* (2013.01)
USPC .............. 365/189.16; 365/189.05; 365/193; 365/194

(58) Field of Classification Search
USPC ...................................... 365/189.05, 189.16
See application file for complete search history.

(56) References Cited

U.S. PATENT DOCUMENTS

| | | | |
|---|---|---|---|
| 6,493,285 B1 | 12/2002 | Wolford | |
| 6,819,599 B2 | 11/2004 | Schaefer | |
| 6,940,768 B2 | 9/2005 | Dahlberg et al. | |
| 7,068,549 B2 | 6/2006 | Cho | |
| 7,092,306 B2 * | 8/2006 | Lee | 365/225.7 |
| 7,102,937 B2 * | 9/2006 | Mukherjee et al. | 365/193 |
| 7,759,998 B2 * | 7/2010 | Ishikawa | 327/261 |
| 7,864,626 B2 * | 1/2011 | Fujiwara | 365/233.13 |
| 8,565,033 B1 * | 10/2013 | Manohararajah et al. | 365/193 |
| 8,570,817 B2 * | 10/2013 | Huang | 365/189.16 |
| 2009/0147597 A1 * | 6/2009 | Cho | 365/189.17 |
| 2013/0294176 A1 * | 11/2013 | Nishio | 365/189.05 |

OTHER PUBLICATIONS

Shiao et al., U.S. Appl. No. 13/562,204, filed Jul. 30, 2012.

* cited by examiner

*Primary Examiner* — Son Mai
(74) *Attorney, Agent, or Firm* — Treyz Law Group; Jason Tsai

(57) ABSTRACT

An integrated circuit may include memory interface circuitry for communicating with off-chip memory. The memory interface circuitry may receive data signals and data strobe signals from different memory devices via respective data ports and data strobe ports. The memory interface circuitry may be operable in at least first and second modes. In the first mode, data signals from each memory device may be received at two respective data ports while the data strobe signal from one memory device is used to clock the data signals at two corresponding read capture registers. In the second mode, data signals from first and second memory devices may be received via first and second data ports, respectively. The data strobe signal from the first memory device may be ignored while the data strobe signal from the second memory device is used to clock the data signals at two corresponding read capture registers.

19 Claims, 11 Drawing Sheets

MEMORY INTERFACE CIRCUITRY WITH DATA STROBE SIGNAL SHARING CAPABILITIES

BACKGROUND

Programmable integrated circuits are a type of integrated circuit that can be configured by a user to implement custom logic functions. In a typical scenario, a logic designer uses computer-aided design (CAD) tools to design a custom logic circuit. When the design process is complete, the CAD tools generate configuration data. The configuration data is loaded into a programmable integrated circuit to configure the device to perform desired logic functions.

In a typical system, a programmable integrated circuit, memory devices, and other electronic components are mounted on a printed circuit board. The programmable integrated circuit includes memory interface circuitry that is used to relay data back and forth between the programmable integrated circuit and the memory devices (i.e., the memory interface circuitry is used to read data from and write data into the memory devices). When performing such memory read and write operations, the timing of control and data signals is critical.

Because programmable integrated circuits can be configured in many different ways and are installed on many different types of boards, the lengths of circuit board traces coupling the programmable integrated circuit to the memory devices can vary from one system to another. As a result, it is generally not possible to know in advance exactly how data and clock paths between a programmable integrated circuit and a given memory device will perform. In some systems, the data and clock paths may have one set of timing characteristics, whereas in other systems the data and clock paths may have a different set of timing characteristics.

During memory read operations, data signals and an associated data strobe signal are synchronously output from a given memory device (i.e., the data signals transition at the clock edges of the data strobe signal). In receiving the data signals and the data strobe signal from the given memory device, the memory interface circuitry uses a dedicated 90° phase shift circuit to shift the data strobe signal so that the rising and falling clock edges of the data strobe signal fall near the center of each data signal. Having one 90° phase shift circuit that is used for shifting the data strobe signal for each corresponding memory device, however, results in significant area overhead and increases cost.

SUMMARY

Integrated circuits such as programmable integrated circuits having memory interface circuitry are provided. The memory interface circuitry may be used to communicate with off-chip memory devices (sometimes referred to as memory groups) that are mounted on a circuit board. The memory devices and the circuit board to which the memory devices are mounted may collectively be referred to as a memory module. Data (DQ) and data strobe (DQS) signals may be transmitted between the memory devices and the memory interface circuitry. The memory interface circuitry may provide system-level control signals (e.g., a reference clock signal, address signal, and command signal) to the memory devices.

During read operations, the memory interface circuitry may send appropriate system control signals to the memory module to read data out of the memory devices. The memory devices may output read data and associated data strobe signals. The read data may be captured using latching circuits. For example, the memory interface circuitry may include at least first and second data ports, first and second data strobe ports, and first and second latching circuits (e.g., data registers).

The memory interface circuitry may be operable in at least first and second modes. In the first mode, the first latching circuit may receive data signals from a given memory integrated circuit device via the first and second data ports and may receive an associated data strobe signal via one of the first and second data strobe ports. The data strobe signal may be fed to both the first and second latching circuits for clocking the first and second data signals.

In the second mode, the first latching circuit may receive first data signals from a first memory integrated circuit device via the first data port, may ignore a first data strobe signal received at the first data strobe port from the first memory integrated circuit device, may receive second data signals from a second memory integrated circuit device via the second data port, may receive a second data strobe signal at the second data strobe port from the second memory integrated circuit device, and may route the second data strobe signal to both the first and second latching circuits for clocking the first and second data signals.

In either mode, the data strobe signal in use may be fed through a quarter clock cycle shifting circuit for placing the rising/falling edges of the data strobe signal at the center of a data valid window associated with incoming data signals. A first delay circuit may be coupled between the first data port and the first latching circuit. A second delay circuit may be coupled between the second data port and the second latching circuit. The first delay circuit may be used to delay the first data signals by a first amount of delay while the second delay circuit may be used to delay the second data signals by a second amount of delay that is different than the first amount of delay. In particular, the first amount of delay may be greater than the second amount of delay by a predetermined value or by a value that is obtained from run-time calibration operations.

Delaying data signals and routing one data strobe signal to two or more read capture circuits in this way may be extended to interface with memory modules having any desired number of memory devices and operated based on any suitable memory communications protocol.

Further features of the present invention, its nature and various advantages will be more apparent from the accompanying drawings and the following detailed description.

DETAILED DESCRIPTION

Embodiments of the present invention relate to integrated circuits that contain memory interface circuitry. The memory interface circuitry may be used to interface with off-chip memory such as random-access memory (RAM). The integrated circuits may be digital signal processors, microprocessors, application specific integrated circuits, or other suitable integrated circuits. With one suitable arrangement, the integrated circuits that communicate with memory are programmable integrated circuits such as programmable logic device integrated circuits or other programmable integrated circuits that contain programmable circuitry. The programmable circuitry can be programmed using configuration data. Programmable integrated circuits are typically operated in a diverse set of system environments. As a result, these integrated circuits tend to benefit from adjustable timing capabilities of the memory interface circuitry.

Figure 1:
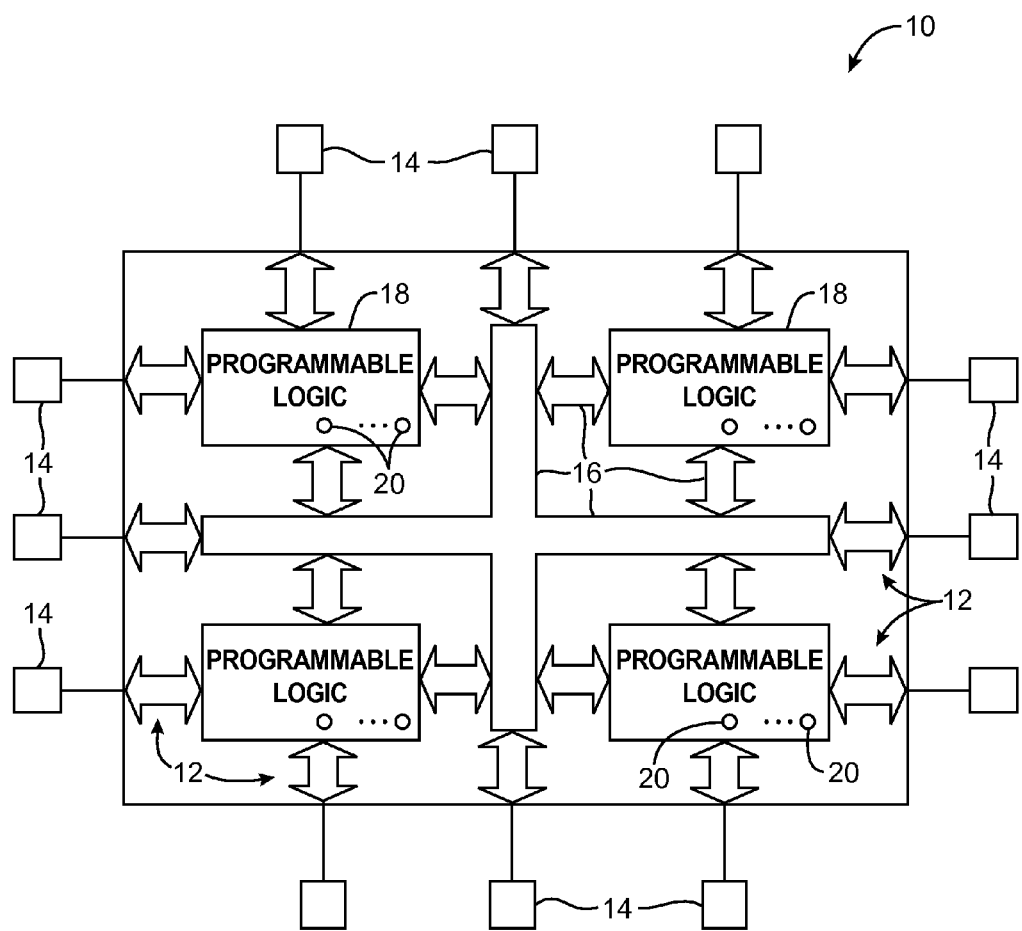
FIG. 1 is a diagram of an illustrative programmable integrated circuit in accordance with an embodiment of the present invention.

FIG. 1 shows a diagram of an illustrative programmable integrated circuit. As shown in FIG. 1, device 10 may have input-output (I/O) circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. For example, programmable logic 18 may include look-up tables, registers, and multiplexers. The programmable logic 18 may be configured to perform a custom logic function. The programmable interconnects associated with interconnection resources may be considered to be a part of programmable logic 18.

Programmable logic 18 contains programmable elements 20. Programmable elements 20 may be based on any suitable programmable technology, such as fuses, antifuses, electrically-programmable read-only-memory technology, random-access memory cells, mask-programmed elements, etc. As an example, programmable elements 20 may be formed from memory cells. During programming, configuration data is loaded into the memory cells using pins 14 and input-output circuitry 12. The memory cells are typically random-access-memory (RAM) cells. Because the RAM cells are loaded with configuration data, they are sometimes referred to as configuration RAM cells (CRAM).

Programmable element 20 may be used to provide a static control output signal for controlling the state of an associated logic component in programmable logic 18. The output signals generated by elements 20 are typically applied to gates of metal-oxide-semiconductor (MOS) transistors (sometimes referred to as pass gate transistors).

The circuitry of device 10 may be organized using any suitable architecture. As an example, logic 18 of programmable device 10 may be organized in a series of rows and columns of larger programmable logic regions, each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Other device arrangements may use logic that is not arranged in rows and columns.

Figure 2:
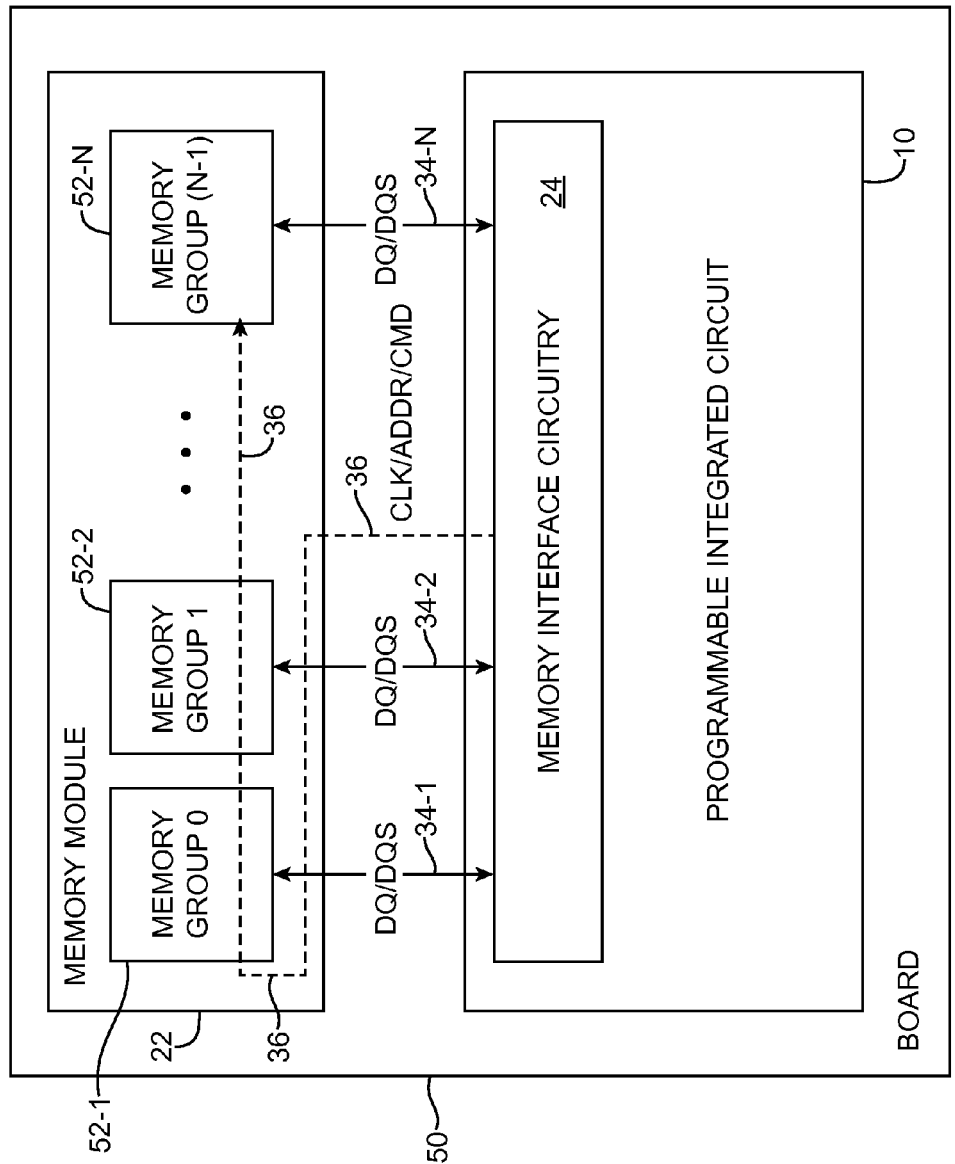
FIG. 2 is a diagram of illustrative memory interface circuitry operating in read leveling mode in accordance with an embodiment of the present invention.

Device 10 may communicate with off-chip memory such as memory module 22 (see, e.g., FIG. 2). Memory module 22 may be a memory device sometimes referred to as a single in-line memory module (SIMM) or a dual in-line memory module (DIMM). Device 10 may be configured to communicate with one memory module 22, two memory modules 22, four memory modules 22, or any suitable number of memory modules 22. As shown in FIG. 2, device 10, memory module 22, and other circuit components (e.g., integrated circuit chips, surface mount components, etc.) may be mounted on a circuit board such as printed circuit board 50. Board components may be interconnected by conductive traces and packaging (e.g., sockets into which integrated circuits are mounted) formed on board 50.

Device 10 may include memory interface circuitry 24 that serves to relay information between memory module 22 and logic circuits 18 that are internal to device 10. Memory interface circuitry 24 may be coupled to memory module 22 through paths 34 (e.g., paths 34-1, 34-2, ..., 34-N) and 36. During memory read operations, data (DQ) signals and data strobe (DQS) signals may be conveyed from memory module 22 to memory interface circuitry 24 over paths 34. During memory write operations, DQ/DQS may be conveyed from memory interface circuitry 24 to memory module 22 over paths 34.

During read and write operations, control signals such as clock CLK, address ADDR, and command CMD may be conveyed from memory interface circuitry 24 to memory module 22 over path 36. Signal CLK may serve as a system reference clock (e.g., a reference clock to which the DQS signals, ADDR, and CMD should be synchronized). Signal CMD may be configured to a first value to initiate a read operation, to a second value to initiate a write operation, to a third value during normal operation, and to other values to initiate any desired operations. Signal ADDR specifies the address (e.g., a selected bank address in a memory device) from which data is read out during read operations and the address to which data is written during write operations.

Memory interface circuitry 24 may serve to perform desired data rate conversions and to generate signals that meet timing requirements specified by the memory protocol currently under use. In some embodiments, memory interface circuitry 24 may include a memory controller that is configured to generate appropriate control signals corresponding to the memory protocol currently under use (e.g., to generate signals for handling memory data management to address desired banks, rows, and columns and to perform memory refresh). The memory controller may also serve to periodically request calibration of memory interface circuitry 24.

In the example of FIG. 2, memory module 22 includes a series of memory devices, at least some of which is sometimes referred to as a memory group. For example, memory module 22 may include first memory group 52-1, second memory group 52-2, . . . , and N$^{th}$ memory group 52-N. Memory module 22 may include at least nine memory groups (as an example). Each of the memory groups may contain hundreds or thousands of memory cells (e.g., dynamic RAM cells). The memory groups may communicate with memory interface circuitry 24 through respective signal paths. For example, first memory group 52-1 may communicate with circuitry 24 by sending data and data strobe signals (DQ/DQS) over path 34-1, second memory group 52-2 may communicate circuitry 24 by sending DQ/DQS over path 34-2, third memory group 52-3 may communicate circuitry 24 by sending DQ/DQS over path 34-3, etc.

In general, memory access operations are not synchronized with system-level control signals CLK/CMD/ADDR. As a result, the DQ signals that are received from the memory groups are not phase aligned with any known clock signal in device 10. It is therefore necessary to provide DQS clock signals with the DQ signals, so that the DQS clocks can be used to establish proper timing relationships when processing the DQ signals. For example, during a read operation, memory interface circuitry 24 uses the DQS clocks in capturing data as it is transmitted over paths 34 from memory 22. In general, the operation of each memory group is somewhat independent, so memory module 22 generates a DQS signal for each of the memory groups.

The DQS signals for the different memory groups are generally not phase aligned with each other (e.g., skew may be present among the DQS signals). For example, although the DQS signal for a first memory group is edge-aligned with the DQ signals in the first memory group, the DQS signal for the first memory group and the seventh memory group (as an example) need not be in phase with each other.

Memory interface circuitry 24 may send control signals to the memory groups via path 36. Memory module 22 in the example of FIG. 2 may be a type of memory module that exhibits inherent non-zero layout skew (e.g., the control signals on path 36 may arrive at each of the memory groups at different times). For example, because of the way path 36 is routed, the control signals on path 36 may arrive first at memory group 52-1 and then arrive at each subsequent memory group after some delay.

During read operations, appropriate control signals may be sent over path 36 to direct the memory groups to output read data. Read data may be generated from the memory groups at different times depending on when control signals CLK/CMD/ADDR arrive at a particular memory group. For example, memory group 52-1 may output read data before subsequent memory group 52-2, memory group 52-2 may output read data before subsequent memory group 52-3, memory group 52-3 may output read data before subsequent memory group 52-4, etc (e.g., data may arrive from the different memory group at staggered time intervals). Memory interface circuitry 24 may therefore receive read data from the different memory groups at staggered times. Memory interface circuitry 24 may include buffer circuitry that can be used to equalize the skew among the different memory groups. Reading data from the different memory groups in this way may be referred to as read leveling mode.

The arrangement of FIG. 2 is merely illustrative and is not intended to limit the scope of the present invention. Integrated circuits other than programmable integrated circuits may include memory interface circuitry 24 that is used to communicate with one or more memory modules 22, each of which can include any suitable number of memory devices.

Figure 3:
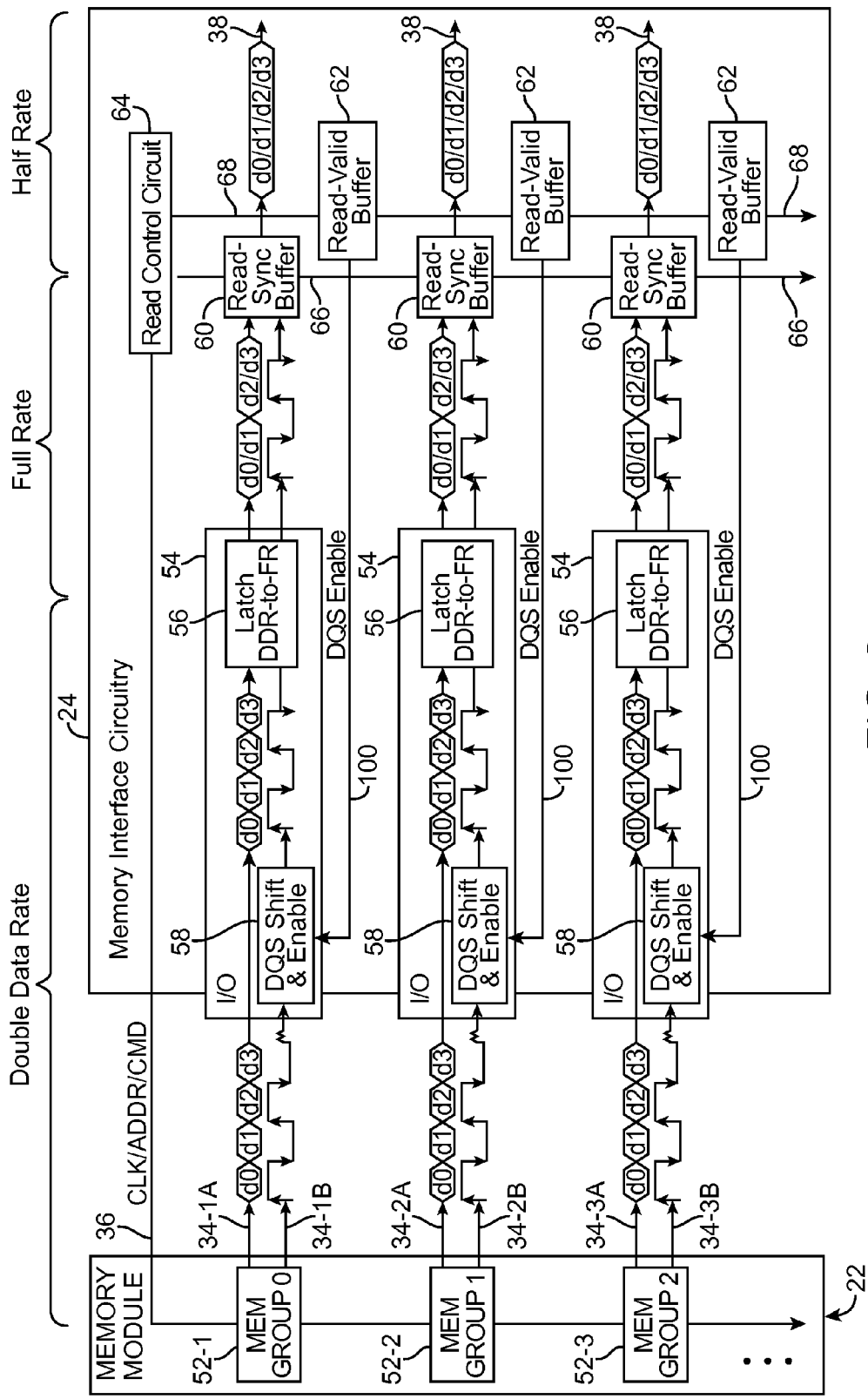
FIG. 3 is a diagram showing an exemplary memory read operation in accordance with an embodiment of the present invention.

FIG. 3 is a diagram showing an illustrative signal flow during read operations. As shown in FIG. 3, the memory groups on memory module 22 may send data signals to corresponding memory interface input-output (I/O) circuits 54 in memory interface circuitry 24. For example, memory group 52-1 may send DQ signals over line 34-1A to a first I/O circuit 54 and may send DQS signals over line 34-1B to the first I/O circuit 54. Similarly, memory group 52-2 may send DQ signals over line 34-2A to a second I/O circuit 54 and may send DQS signals over line 34-2B to the second I/O circuit 54, and so on.

System control signals CLK/ADDR/CMD may be conveyed to the memory groups over path 36. As shown in FIG. 3, memory group 52-1 may output DQ/DQS signals before any other memory group, because group 52-1 receives the system control signals before the other memory group. Similarly, memory group 52-2 may output DQ/DQS signals before all subsequent memory groups (i.e., before memory groups 52-3, 52-4, . . . , 52-N). Memory module 22 may therefore generate read data from the memory groups at different points in time.

Memory interface I/O circuit 54 may include latching circuit 56 and DQS shift and enable circuitry 58. Latching circuit 56 may have a first input that receives DQ signals from an associated memory group and a second input that receives DQS signals from the associated memory group through DQS enable circuitry 58. Circuitry 58 may serve to align the DQS signals to the DQ signals and may also serve to gate the DQS signals so that any glitches present before or after the DQS burst are eliminated. In some embodiments, circuitry 58 configured to align the DQS signals to the DQ signals may shift the DQS signals with respect to the DQ signals and may therefore sometimes be referred to as DQS shift and enable circuitry.

DQS enable circuitry 58 may receive a DQS_Enable signal from an associated read-valid buffer 62 (sometimes referred to as a first-in-first-out circuit) via path 100. Buffer 62 may be coupled to a control circuit such as read control circuit 64. Read control circuit 64 may be used to generate system control signals CLK/ADDR/CMD over path 36 and may also be used to provide an enable signal having a pulse width that is approximately equal to the desired DQS burst length. The enable signal may be provided to each read-valid buffer 62 over path 68. Buffer 62 may delay the enable signal by some adjustable amount to generate a corresponding DQS_Enable_signal.

Latching circuit 56 may serve to latch the DQ signals (received at its first input) at the rising and falling edges of the DQS signals (received at its second input). Latching circuit 56 of this type may therefore sometimes be referred to as a double-edge-triggered data capture circuit or a read capture register. The DQ signals received by latching circuit 56 toggle at both rising and falling edges of DQS. Data transfer of this type may sometimes be referred to as double data rate (DDR) transmission.

Latching circuit 56 may have first and second outputs. DQ signals transmitting at full data rate (FR) may be provided at the first output of latching circuit 56. DQS signals provided at the second output of latching circuit 56 may be a substantially unaltered version of the DQS signals received at the second input of latching circuit 56. The DQ signals generated at the first output of latching circuit 56 may be a two-bit parallel output signal toggling at the rising edges of DQS (as an example). Latching circuit 56 that is used to capture and output data in this arrangement may sometimes be referred to as a DDR-to-FR capture circuit.

Memory interface I/O circuit 54 may be coupled to an associated read-synchronization buffer 60. In particular, read-sync buffer 60 may have a first input coupled to the first output of latching circuit 56 and a second input coupled to the second output of latching circuit 56. Buffer 60 may, for example, have an output on which a four-bit parallel output signal toggling at every other rising edge of DQS received at its second input is provided (e.g., buffer 60 may output data at half data rate (HR)). The output of buffer 60 fed to corresponding logic circuits 18 on device 10. Buffer 60 that is used to delay and output data in this way may sometimes be referred to as a FR-to-HR buffer circuit.

Buffer 60 may be coupled to read control circuit 64. Read control circuit 64 may be used to synchronize buffers 60 so that read data is output simultaneously in parallel (e.g., by sending control signals to read-sync buffers 60 over line 66). Read control circuit 64 may include a read latency counter that takes into account a maximum round trip delay. The maximum round trip delay may be equal to the amount of time elapsed since the launch of a read command (on path 36) to the time DQ signals arrive at buffer 60 associated with last memory group 52-N (i.e., the memory group that is last to receive the read command). Data is read out from buffers 60 in parallel when the counter exceeds a predetermined threshold. The predetermined threshold may be at least equal to or greater than the maximum round trip delay. Delaying the read-sync buffers in this way ensures that the data from the memory groups has successfully been stored at the read-sync buffers prior to readout.

As shown in FIG. 3, circuitry 58 may have a first input that receives a DQS signal from memory module 22, a second input that receives signal DQS_Enable from associated read-valid buffer 62, and an output on which a clean and/or shifted DQS signal is provided. In general, the DQS signal that is being conveyed from memory module 22 to the first input of DQS enable circuitry 58 can exhibit unwanted glitches. Circuitry 58 may be used to filter out these spurious signals. The memory interface circuitry 26 of FIG. 3 is merely illustrative and does not serve to limit the scope of the present invention. Latch circuit 56 may be implemented using one or more read capture registers, two or more read capture registers, etc. If desired, circuitry 58 may receive data strobe signals from one or more memory groups in memory module 22.

In general, it may be desirable for memory interface circuitry 24 to be able to interface with different types of memory module architectures. As an example, a memory module 22 may include memory devices 52 each having ten input-output pins, two of which are used for conveying a differential DQS signal and eight of which are used for conveying associated DQ signals. Such types of memory devices may sometimes be referred to as "x8" memory devices, and circuitry 24 capable of interfacing with such types of memory devices may be referred to as supporting x8 memory operation. As another example, a memory module 22 may include memory devices 52 each having six input-output pins, two of which are used for carrying a differential DQS signal and four of which are used for carrying associated DQ signals. Such types of memory devices may sometimes be referred to as "x4" memory devices, and circuitry 24 capable of interfacing with such types of memory devices may be referred to as supporting x4 memory operation.

It may be desirable for memory interface circuitry 24 on device 10 to be capable of supporting multiple types of memory devices (e.g., for memory interface circuitry 24 to interface with both x8 and x4 memory devices). When supporting the x8 memory mode, memory interface circuitry 24 may include one DQS shifter 58 for each group of ten input-output pins (e.g., each x8 memory device may output a differential DQS signal that is shifted using a corresponding DQS shifter 58).

When supporting the x4 memory mode, memory interface circuitry 24 may receive a first DQS signal and an associated first group of four DQ signals from a first memory device and may receive a second DQS signal and an associated second group of four DQ signals from a second memory device that is adjacent to the first memory device. When operated in the x4 memory mode, memory interface circuitry 24 may use one DQS shifter 58 to shift the second DQS signal, thereby generating a shifted DQS that is used for clocking both the first and second groups of DQ signals from the first and second memory devices (e.g., DQS from one memory device may be shared between neighboring memory devices). The first DQS signal from the first memory device need not be used. Using the DQS signal from one memory device to clock data signals from another memory device may therefore allow for fewer DQS shifting circuits 58 to be formed on device 10, thereby providing substantial area savings (e.g., memory interface circuitry 24 operated using this arrangement may support x4 in addition to x8 memory operation without substantial area overhead).

Figure 4:
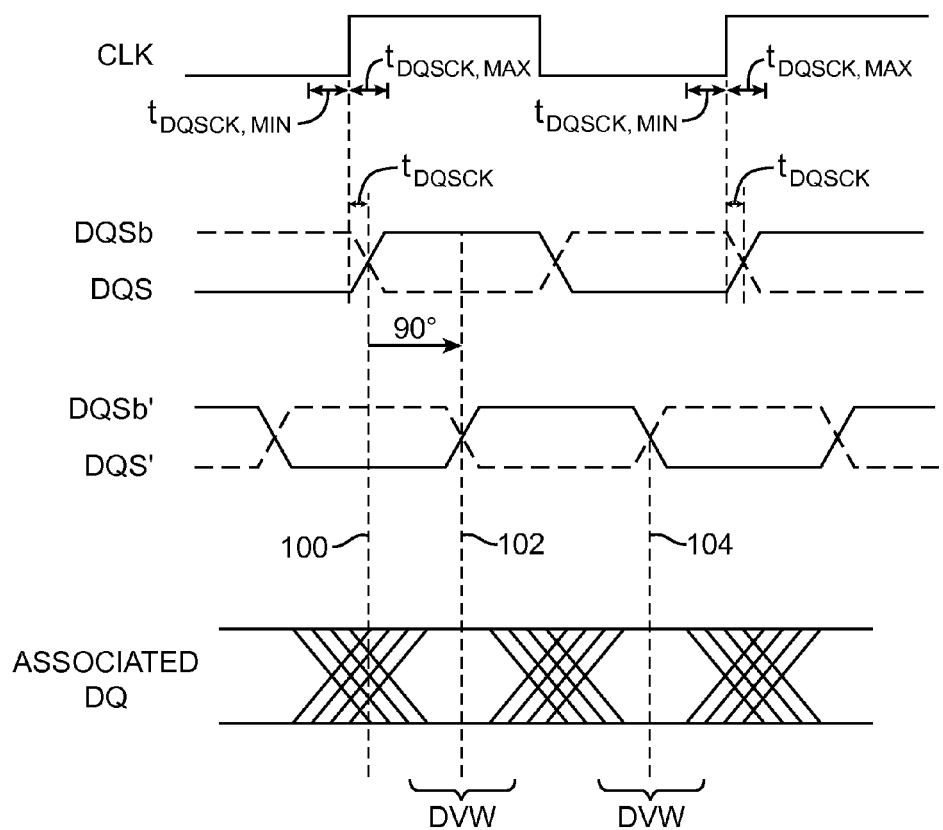
FIG. 4 is a diagram illustrating the timing relationship between a data strobe signal and associated data signals during a read operation in accordance with an embodiment of the present invention.

FIG. 4 is a diagram showing the timing relationship for data and data strobe signals output from a memory device 52. As shown in FIG. 4, the read data strobe signal DQS (and differential component DQSb) should be edge-aligned with system reference clock signal CLK. In particular, the rising edge of DQS should not vary by more than $t_{DQSCK,MAX}$ and $t_{DQSCK,MIN}$ from the corresponding rising edge in CLK (as determined by memory specification). Timing error $t_{DQSCK}$ indicates the amount of edge offset that is actually present between the rising edge of DQS and the corresponding CLK rising edge. The magnitude of timing error $t_{DQSCK}$ should be less than $t_{DQSCK,MAX}$ and $t_{DQSCK,MIN}$.

The transitions in the associated DQ signals should also be edge-aligned with the DQS clock edges (as indicated by dashed line 100). In general, skew may be present in the different DQ signals as each data path may be slightly different in length and may exhibit different parasitic effects. Taking into account the skew/variation of the different DQ signals, the period of time during which all the data signals are valid for sampling is sometimes referred to as the data valid window (DVW). Memory interface circuitry 24 may include DQS shifting circuitry for shifting data strobe signals by 90° (i.e., a quarter clock cycle) so that the rising and falling clock edges of the delayed data strobe signal DQS' (and differential component DQSb') are centered within the data valid window as indicated by dashed lines 102 and 104, respectively.

Raw data signals generated by a memory device 52 may exhibit data skew that reduces the data valid window. Per-bit DQ deskew operations may be performed to maximize the data valid window, whereas DQ/DQS centering operations may be performed to maximize the timing margins associated with latching the data signals with the corresponding data strobe signal (e.g. to place the rising edges of DQS at the center of each DVW to optimize setup and hold times associated with latching the data signals).

Figure 5A:
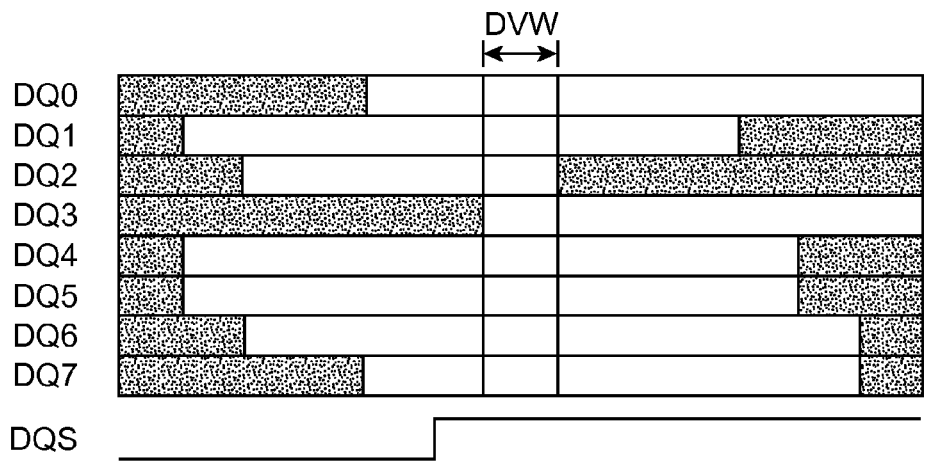
FIGS. 5A-5C are diagrams showing illustrative steps involved in performing per-bit data deskew and data strobe centering in accordance with an embodiment of the present invention.
Figure 5B:
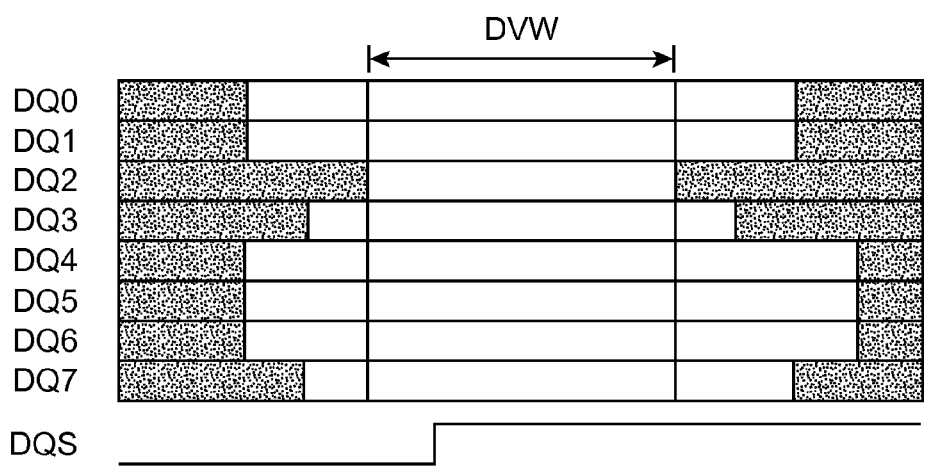
Figure 5C:
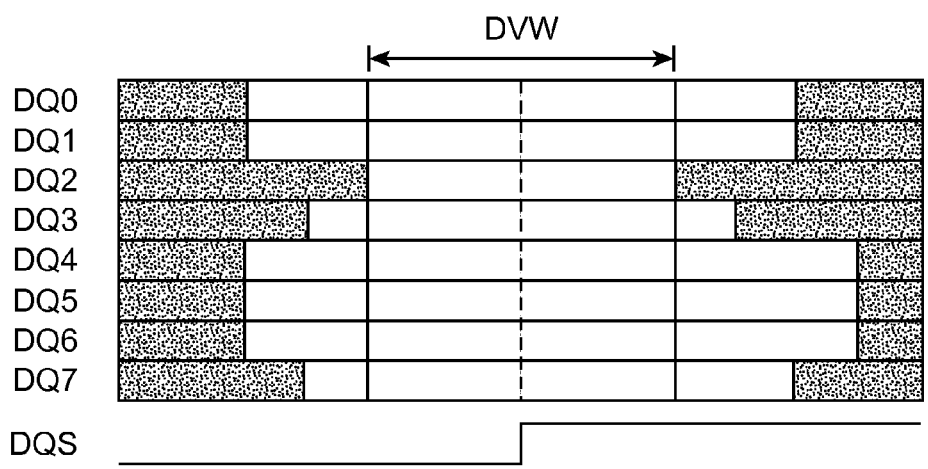

FIGS. 5A, 5B, and 5C are diagrams showing illustrative steps involved in performing per-bit DQ deskew and read DQ/DQS centering for an x8 memory device. FIG. 5A shows a first snapshot in time before DQ deskew has been performed. As shown in diagram FIG. 5A, data signals DQ0-DQ7 may be offset in time with respect to one another, resulting in a substantially reduced data valid window. Signal DQS is also not positioned at the center of the data valid window.

FIG. 5B shows a second snapshot in time after DQ deskew has been performed. In the example of FIG. 5B, data signals DQ0, DQ3, and DQ7 may be shifted left in time while data signals DQ1, DQ2, DQ4, DQ5, and DQ6 may be shifted right in time to maximize the data valid window. Shifting data signals in this way ensures that the data valid window is at least equal to the duration associated with the smallest data eye opening (e.g., the eye width of DQ2 in this particular example). At this point, signal DQS may still not be positioned at the center of the optimized data valid window.

FIG. 5C shows a third snapshot in time after DQ/DQS centering has been performed. In this example, data strobe signal DQS may be shifted right in time so that DQS is placed at the center of the data valid window. If desired, the data signals DQ0-DQ7 may be shifted in unison with respect to DQS to center DQS within the data valid window. When performing DQ/DQS centering, the DQ signals may be delayed to determine the DQ range (e.g., to measure a setup time) during a first evaluation phase while the DQS signals may be delayed to determine the DQS range (e.g., to measure a hold time) during a second evaluation phase. Information such as the DQ range and the DQS range may be used to determine an amount by which the DQ or DQS signals need to be shifted in order to center DQS within the data valid window.

Figure 6:
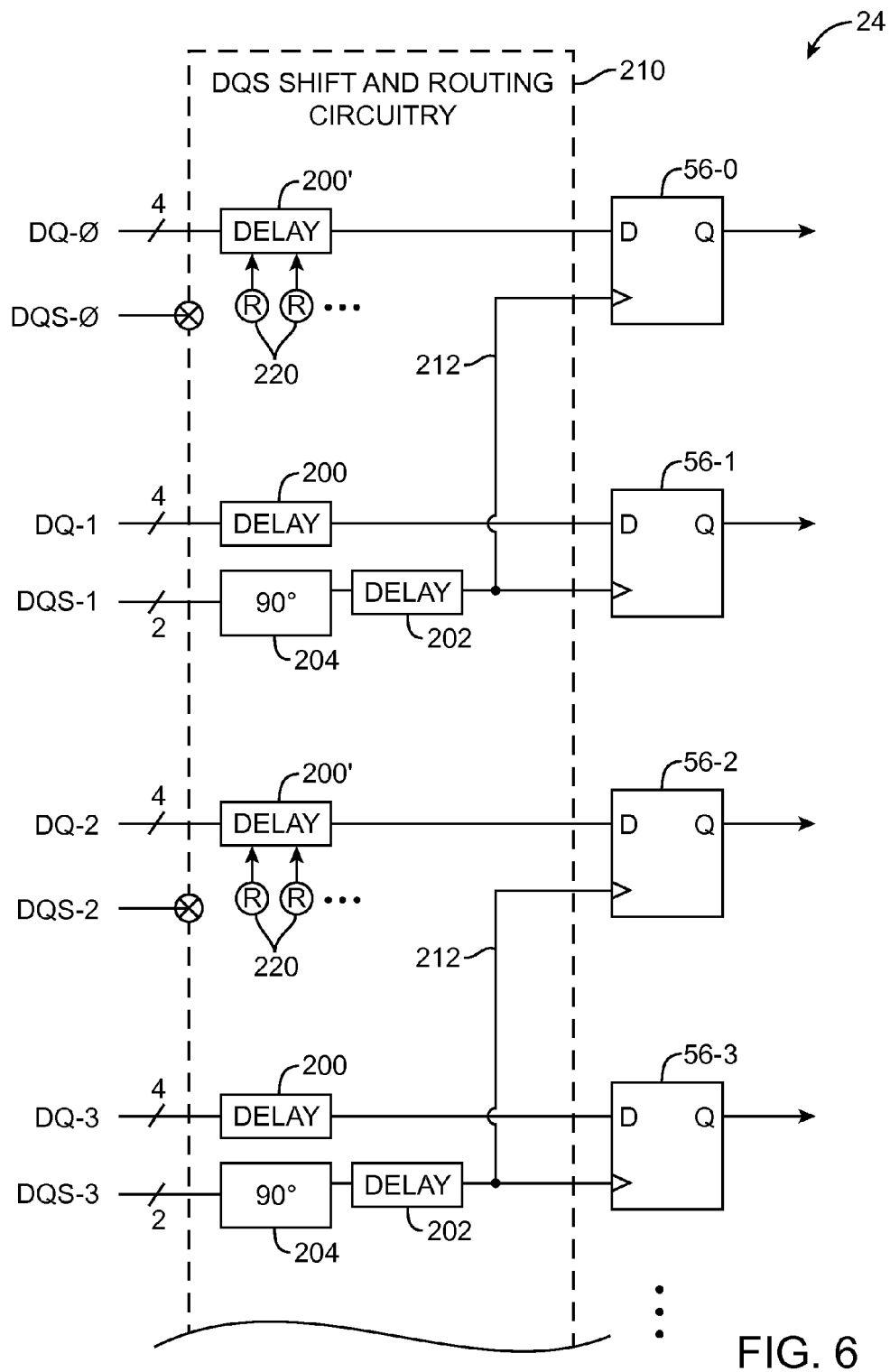
FIG. 6 is a diagram of illustrative data strobe shift and routing circuitry in accordance with an embodiment of the present invention.

FIG. 6 is a diagram showing one illustrative implementation of memory interface circuitry 24. As shown in FIG. 6, memory interface circuitry 24 may include DQS shift and routing circuitry 210 for receiving data and data strobe signals from the different memory devices on memory module 22 and for routing the data signals and optionally, a selected portion of the data strobe signals to corresponding read capture registers 56. Circuitry 210 may have a first data port DQ-0 and associated data strobe port DQS-0, a second data port DQ-1 and associated data strobe port DQS-1, a third data port DQ-2 and associated data strobe port DQS-2, a fourth data port DQ-3 and associated data strobe port DQS-3, and so on. Each of the different data ports may receive data signals from multiple data pins in parallel. Each of the different data strobe ports may be operable to receive a differential data strobe signal.

First data port DQ-0 may be coupled to data input D of read capture register 56-0 via a first delay circuit 200'; second data port DQ-1 may be coupled to data input D of read capture register 56-1 via a first delay circuit 200; third data port DQ-2 may be coupled to data input D of read capture register 56-2 via a second delay circuit 200'; fourth data port DQ-3 may be coupled to data input D of read capture register 56-3 via a second delay circuit 200; and so on.

Data strobe ports DQS-0, DQS-2, DQS-4, and other even-numbered data strobe ports may receive data strobe signals from external memory devices but may not be connected to any internal circuitry (e.g., the even-numbered data strobe ports may be formed as floating terminals). Data strobe port DQS-1 may be coupled to the clock control input of both read capture registers 56-0 and 56-1 via first 90° phase shift circuit 204 and first delay circuit 202, whereas data strobe port DQS-3 may be coupled to the clock control input of both read capture registers 56-2 and 56-3 via second 90° phase shift circuit 204 and second delay circuit 202 (e.g., the odd-numbered data strobe ports may receive data strobe signals from external memory devices and may be coupled to the clock inputs of a corresponding pair of adjacent read capture registers).

While the data ports are always in use, at least some of the data strobe ports are left unused. Phase shift circuits 204 may be used to provide the desired quarter clock cycle shift as described in connection with FIG. 4 (as an example). If desired, circuits 204 may be used to provide a half clock cycle shift or delays that are equal to other suitable fractions of a clock cycle. Delay circuits 200, 200', and 202 may be programmed during per-bit DQ deskew and DQ/DQS centering operations to help optimize timing margins (e.g., to help maximize DVW and setup/hold times).

In the example of FIG. 6, each of the data ports may be used to receive four bits of data signals in parallel via four corresponding data pins. Circuitry 24 configured in this arrangement may be operable to interface with x8 memory devices and x4 memory devices. When supporting x8 memory operation, data ports DQ-0 and DQ-1 may be used to receive an 8-bit data signal from a first memory device 52 while data ports DQ-2 and DQ-3 may be used to receive an 8-bit data signal from a second memory device 52. The first memory device may output a first data strobe signal that is fed to registers 56-0 and 56-1 via port DQS-1, whereas the second memory device may output a second data strobe signal that is fed to registers 56-2 and 56-3 via port DQS-3. In the x8 scenario, the even data strobe ports (i.e., DQS-0, DQS-2, DQS-4, etc.) do not receive any signals from the memory devices.

Memory interface circuitry 24 may also be configured to interface with x4 memory devices. When supporting x4 memory operation, data port DQ-0 may be used to receive a 4-bit data signal from a first memory device 52, data port DQ-1 may be used to receive a 4-bit data signal from a second memory device 52, data port DQ-2 may be used to receive a 4-bit data signal from a third memory device 52, data port DQ-3 may be used to receive a 4-bit data signal from a fourth memory device 52, and so on. The first memory device may output a first differential data strobe signal to port DQS-0, the second memory device may output a second differential data strobe signal to port DQS-1, the third memory device may output a third differential data strobe signal to port DQS-2, the fourth memory device may output a fourth differential data strobe signal to port DQS-3, and so on.

In the x4 operation, data strobe signals received at ports DQS-0 and DQS-2 may be ignored (e.g., data strobe signals received at the even-numbered data strobe ports need not be used). The data strobe signals received at the odd-numbered data strobe ports may, however, be used to latch data signals read from more than one memory device (e.g., the data strobe signal from the "x+1-th" memory device may be used to clock data from the "x-th" memory device and from the "x+1-th" memory device). Sharing data strobe signals in this way allows for a reduced number of circuits 204 to be formed on device 10, thereby saving area (e.g., using every second DQS signal to clock data at an adjacent pair of read capture registers reduces cost).

In this particular example, it may be desirable to configure delay circuit 200' associated with port DQ-0 with a larger delay setting relative to that of delay circuit 200 associated with port DQ-1 since the data strobe signal from port DQS-1 will be arriving at capture circuit 56-0 after a predetermined time interval following the arrival of data signals at port DQ-0. Delay circuit 200' may be adjusted by providing storage elements 220 with appropriate control bits. Storage element 220 may be a volatile memory element (e.g., a CRAM cell loaded with configuration data, etc.) or a nonvolatile memory element (e.g., fuses, antifuses, electrically-programmable read-only memory elements, etc.). This predetermined time interval delay may be a result of the read leveling operation as described in connection with FIG. 2. This additional delay provided by delay circuit 200' may be programmed statically based on a predetermined leveling delay or via a run-time calibration algorithm that characterizes the delay between the arrival times of adjacent DQ/DQS ports upon device startup. This signal timing approach may be extended to other data and data strobe ports in DQS shift and routing circuitry 210.

As described above, routing data strobe signals to more than one read capture registers 56 may provide memory interface circuitry 24 with the capability of supporting more than one mode of memory operation. The example of FIG. 6 in which memory interface circuitry 24 is operable to support x4 and x8 memory devices for double-data-rate (DDR) memory operation is merely illustrative and does not serve to limit the scope of the present invention. If desired, memory interface circuitry 24 may be configured to support x9 and x18 memory devices for quad-data-rate (QDR) and other suitable memory communications protocols. If desired, DQS shift and routing circuitry 210 may be configured to share data strobe signals among at least three read capture registers to provide support for more than two modes of memory operation (e.g., to provide support for x9, x18, and x36 memory devices).

Figure 7:
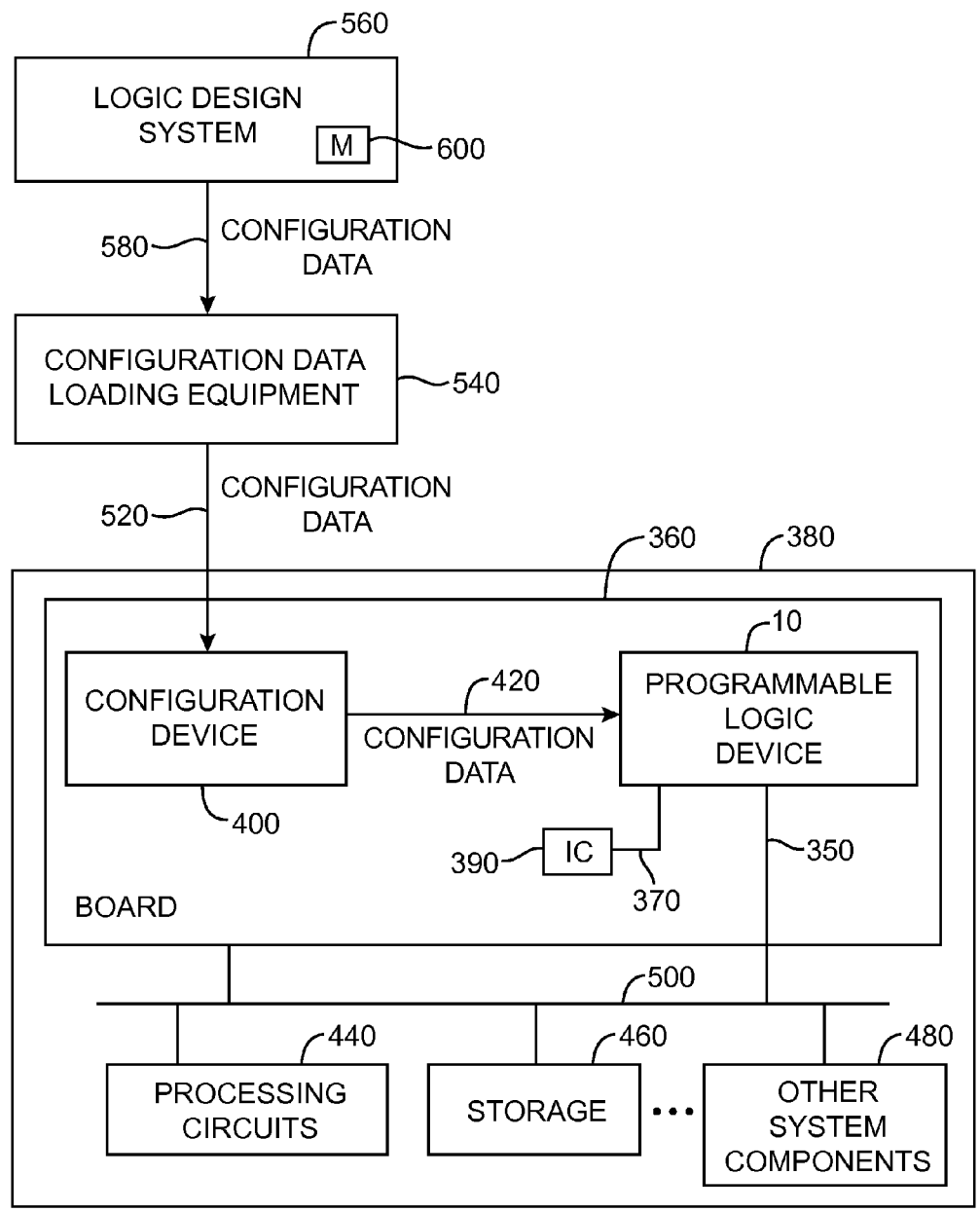
FIG. 7 is a diagram of an illustrative system environment in which a programmable integrated circuit may be configured using a logic design system in accordance with an embodiment of the present invention.

An illustrative system environment for designing and configuring a programmable integrated circuit 10 is shown in FIG. 7. Device 10 may be mounted on a board 360 in a system 380. Device 10 may receive configuration data from programming equipment or from any other suitable equipment or device.

In the example of FIG. 6, device 10 is a type of programmable integrated circuit that receives configuration data from an associated integrated circuit 400. With this type of arrangement, circuit 400 may, if desired, be mounted on the same board 36 as device 10. Circuit 400 may be a programmable logic device configuration data loading chip that loads configuration data into programmable logic device memory from an external electrically erasable-programmable read-only memory (EEPROM) chip, a programmable logic device configuration data loading chip with built-in memory (sometimes referred to as a configuration device), or any other suitable device. When system 380 boots up (or at another suitable time), the configuration data may be supplied to device 10 from device 400, as shown schematically by path 420. The configuration data that is supplied to device 10 may be stored in its programmable elements 20 (e.g., configuration random-access-memory elements).

System 380 may include processing circuits 440, storage 460, and other system components 480 that communicate with device 10. The components of system 380 may be located on one or more boards such as board 360 or other suitable mounting structures or housings.

Communication paths may be used to interconnect device 10 to other components. For example, communication path 370 may be used to convey data between an integrated circuit 390 that is mounted on board 360 and device 10. Communication paths 350 and 500 can be used to convey signals between device 10 and components 440, 460, and 480.

Configuration device 400 may be supplied with the configuration data for device 10 over a path such as path 520. Configuration device 400 may, for example, receive the configuration data from configuration data loading equipment 540 or other suitable equipment that stores the configuration data in configuration device 400. Device 400 may be loaded with data before or after installation on board 360.

It can be a significant undertaking to design and implement a desired logic circuit in a programmable logic device. Logic designers therefore generally use logic design systems based on computer-aided-design (CAD) tools to assist them in designing circuits. A logic design system (sometimes referred to as a circuit design system) can help a logic designer design and test complex circuits for a system. When a design is complete, the logic design system may be used to generate configuration data for electrically programming the appropriate programmable logic device. The logic design system may be implemented on computing equipment.

As shown in FIG. 7, the configuration data produced by a logic design system 560 may be provided to equipment 540 over a path such as path 580. Equipment 540 provides the configuration data to device 400 so that device 400 can later provide this configuration data to device 10 over path 420. System 560 may be based on one or more computers and one or more software programs. In general, software and data may be stored on any computer-readable medium (storage) in system 560 and is shown schematically as storage 600.

In a typical scenario, logic design system 560 is used by a logic designer to create a custom circuit design. The system 560 produces corresponding configuration data which is provided to configuration device 400. Upon power-up, configuration device 400 and data loading circuitry on device 10 is used to load the configuration data into the programmable memory elements 20 of device 10. Device 10 may then be used in normal operation of system 380.

Figure 8:
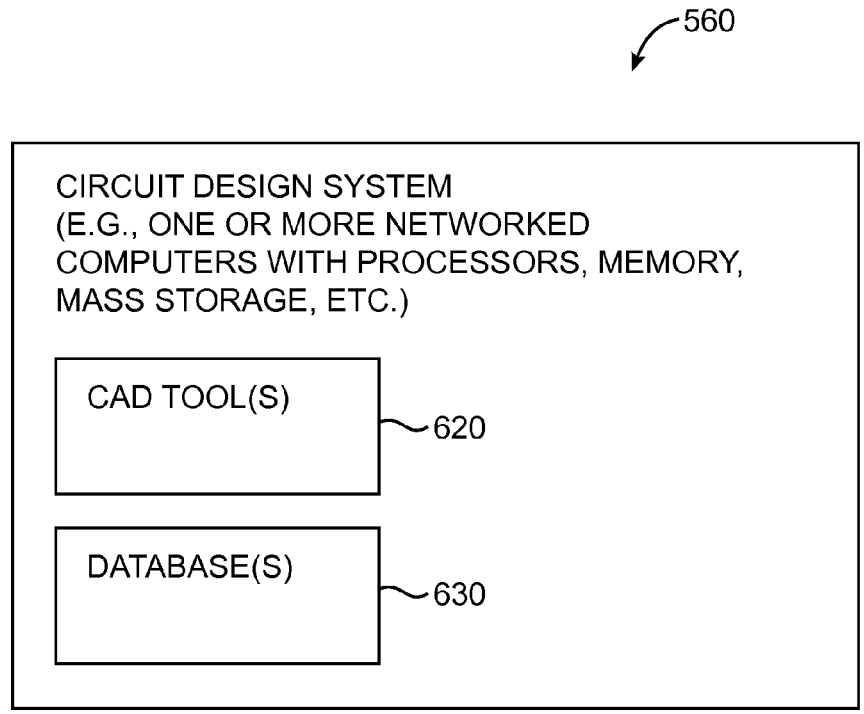
FIG. 8 is a diagram of a logic design system for generating configuration data for implementing custom circuit designs in programmable integrated circuits in accordance with an embodiment of the present invention.

An illustrative logic design system 560 in accordance with the present invention is shown in FIG. 8. System 560 may be based on one or more processors such as personal computers, workstations, etc. The processor(s) may be linked using a network (e.g., a local or wide area network). Memory in these computers or external memory and storage devices such as internal and/or external hard disks may be used to store instructions and data.

Software-based components such as computer-aided design tools 620 and databases 630 reside on system 560. During operation, executable software such as the software of computer aided design tools 620 runs on the processor(s) of system 560. Databases 630 are used to store data for the operation of system 560. In general, software and data may be stored on any computer-readable medium (storage) in system 560. Such storage, which is shown schematically as storage 600 of FIG. 7, may include computer memory chips, removable and fixed media such as hard disk drives, flash memory, compact discs (CDs), DVDs, other optical media, and floppy diskettes, tapes, or any other suitable memory or storage device(s). When the software of system 560 is installed, the storage 600 of system 560 has instructions and data that cause the computing equipment in system 560 to execute various methods (processes). When performing these processes, the computing equipment is configured to implement the functions of the logic design system.

The computer aided design (CAD) tools 620, some or all of which are sometimes referred to collectively as a CAD tool, may be provided by a single vendor or multiple vendors. Tools 620 may be provided as one or more suites of tools (e.g., a compiler suite for performing tasks associated with implementing a circuit design in a programmable logic device) and/or as one or more separate software components (tools). Database(s) 630 may include one or more databases that are accessed only by a particular tool or tools and may include one or more shared databases. Shared databases may be accessed by multiple tools. For example, a first tool may store data for a second tool in a shared database. The second tool can access the shared database to retrieve the data stored by the first tool. This allows one tool to pass information to another tool. Tools may also pass information between each other without storing information in a shared database if desired.

Figure 9:
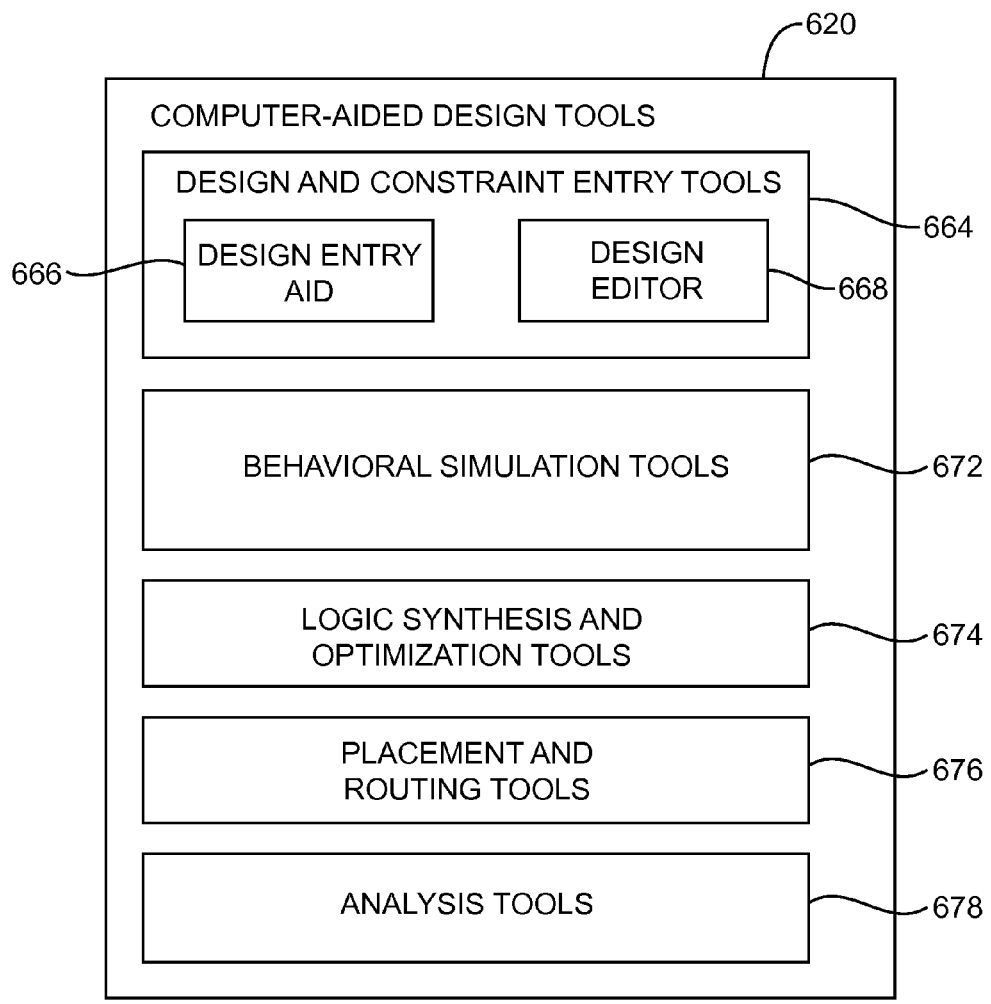
FIG. 9 is a diagram of illustrative computer-aided design (CAD) tools that may be used in a logic design system in accordance with an embodiment of the present invention.

Illustrative computer aided design tools 620 that may be used in a logic design system such as system 560 of FIGS. 7 and 8 are shown in FIG. 9.

The design process typically starts with the formulation of logic circuit functional specifications (e.g., a functional description of the logic circuit). A logic designer can specify how a desired circuit should function using design and constraint entry tools 664. Design and constraint entry tools 664 may include tools such as design and constraint entry aid 666 and design editor 668. Design and constraint entry aids such as aid 666 may be used to help a logic designer locate a desired design from a library of existing logic designs and may provide computer-aided assistance to the logic designer for entering (specifying) the desired design.

As an example, design and constraint entry aid 666 may be used to present screens of options for a user. The user may click on on-screen options to select whether the circuit being designed should have certain features. Design editor 668 may be used to enter a design (e.g., by entering lines of hardware description language code), may be used to edit a design obtained from a library (e.g., using a design and constraint entry aid), or may assist a user in selecting and editing appropriate prepackaged code/designs.

Design and constraint entry tools 664 may be used to allow a logic designer to provide a desired logic design using any suitable format. For example, design and constraint entry tools 664 may include tools that allow the logic designer to enter a logic design using truth tables. Truth tables can be specified using text files or timing diagrams and may be imported from a library. Truth table logic design and constraint entry may be used for a portion of a large circuit or for an entire circuit.

As another example, design and constraint entry tools 664 may include a schematic capture tool. A schematic capture tool may allow the logic designer to visually construct logic circuits from constituent parts such as logic gates and groups of logic gates. Libraries of preexisting logic circuits may be used to allow a desired portion of a design to be imported with the schematic capture tools.

If desired, design and constraint entry tools 664 may allow the logic designer to provide a logic design to the logic design system 560 using a hardware description language such as Verilog hardware description language (HDL) or Very High Speed Integrated Circuit Hardware Description Language (VHDL). The designer of the logic circuit can enter the logic design by writing hardware description language code with editor 668. Blocks of code may be imported from user-maintained or commercial libraries if desired.

After the design has been entered using design and constraint entry tools 664, behavioral simulation tools 672 may be used to simulate the functional performance of the design. If the functional performance of the design is incomplete or incorrect, the logic designer can make changes to the design using design and constraint entry tools 664. The functional operation of the new design can be verified using behavioral simulation tools 672 before synthesis operations have been performed using tools 674. Simulation tools such as tools 672 may also be used at other stages in the design flow if desired (e.g., after logic synthesis). The output of the behavioral simulation tools 672 may be provided to the logic designer in any suitable format (e.g., truth tables, timing diagrams, etc.).

Once the functional operation of the logic design has been determined to be satisfactory, logic synthesis and optimization tools 674 may be used to implement the logic design in a particular programmable logic device (i.e., in the logic and interconnect resources of a particular programmable logic device product or product family).

Tools 674 attempt to optimize the design by making appropriate selections of hardware to implement different logic functions in the logic design based on the logic design data and constraint data entered by the logic designer using tools 664.

After logic synthesis and optimization using tools 674, the logic design system may use tools such as placement and routing tools 676 to perform physical design steps (layout synthesis operations). Placement and routing tools 676 are used to determine how to place the circuits for each logic function within the programmable logic device. For example, if two counters interact with each other, the placement and routing tools 676 may locate these counters in adjacent logic regions on the programmable logic device to reduce interconnect delays or to satisfy timing requirements specifying the maximum permitted interconnect delay. The placement and routing tools 676 create orderly and efficient implementations of logic designs for a given programmable logic device.

Tools such as tools 674 and 676 may be part of a compiler suite (e.g., part of a suite of compiler tools provided by a programmable logic device vendor). In accordance with the present invention, tools such as tools 674, 676, and 678 automatically take into account the effects of crosstalk between interconnects while implementing a desired circuit design. Tools 674, 676, and 678 may also include timing analysis tools. This allows tools 674 and 676 to satisfy performance requirements (e.g., timing requirements) when generating configuration data for programming integrated circuits such as programmable integrated circuit 10.

After an implementation of the desired logic design in the programmable logic device has been generated using placement and routing tools 676, the implementation of the design may be analyzed and tested using analysis tools 678. After satisfactory optimization operations have been completed using tools 620, tools 620 can produce the configuration data for the programmable logic device.

Figure 10:
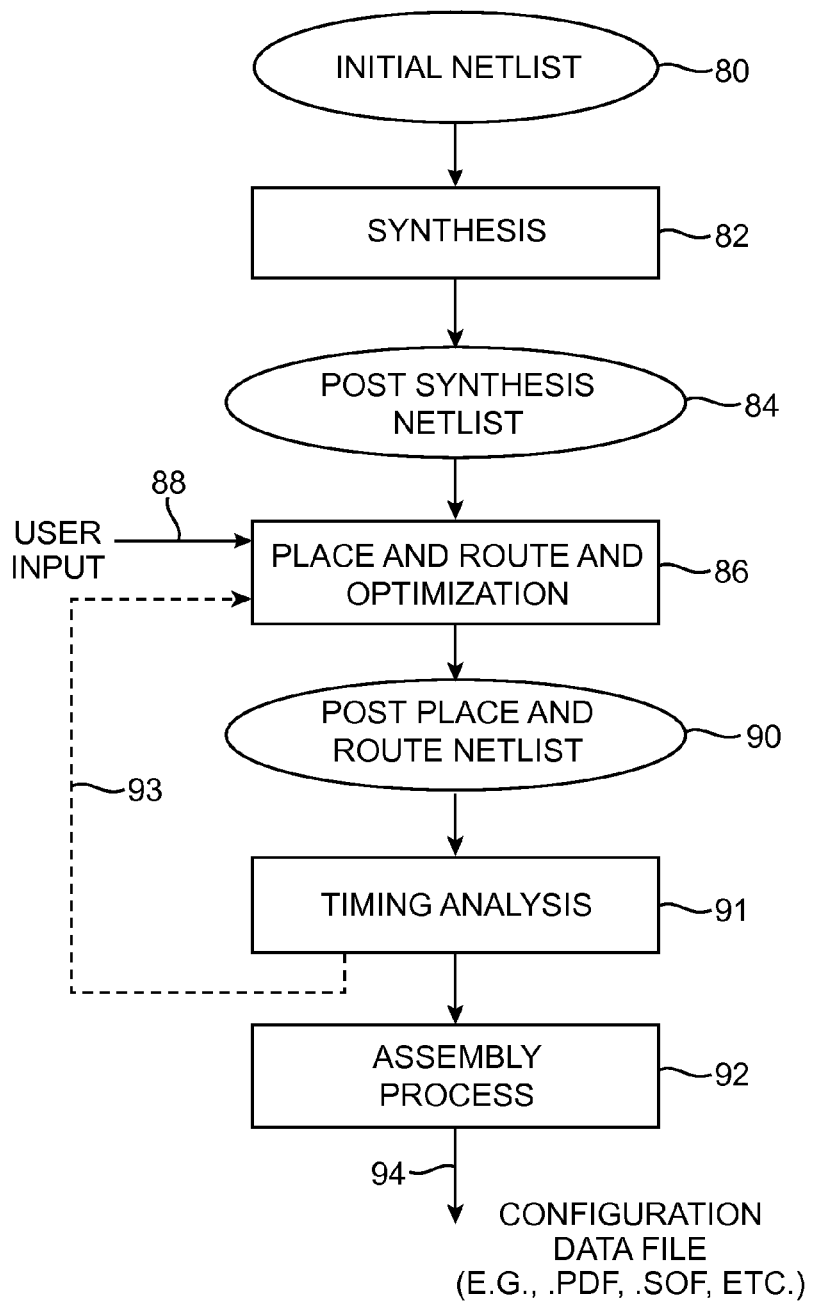
FIG. 10 is a flow chart of illustrative steps for designing a custom logic circuit and performing timing analysis in accordance with an embodiment of the present invention.

Illustrative operations involved in using tools 620 of FIG. 9 to produce configuration data files are shown in FIG. 10. As shown in FIG. 10, an initial netlist 80 is synthesized at step 82 to produce a post-synthesis netlist 84. At step 86, user input 88 and the post synthesis netlist 84 are processed during place and route and optimization operations. During the operations of step 86, the CAD tools 620 take account of the effects of using different positive power supply voltages and/or body bias voltages and, through appropriate selection of power supply and body bias levels, circuit resource assignments, and placement decisions, tools 62 reduce power consumption while satisfying design constraints.

The resulting netlist 90 may be processed further by performing a timing analysis using logic design system 560 (step 91). The timing analysis may be used to help ensure that the final netlist 90 satisfies timing constraints before configuring programmable integrated circuit 10. In characterizing the performance of memory interface circuitry 24, timing analysis 91 may take into account the worst case deviation between DQS signals arriving from different memory devices 52, which can vary up to $t_{DQSCK,TOT}$. The worst case variation $t_{DQSCK,TOT}$ may be equal to the sum of $t_{DQSCK,MIN}$ and $t_{DQSCK,MAX}$ as specified by the memory protocol currently being supported (see, FIG. 4). This timing consideration may limit the maximum operating frequency operation of memory interface circuitry 24.

If desired, processing may optionally loop back to step 86 via path 93 to perform additional optimizations using the final netlist. For example, logic design system 560 may identify routing paths in the final netlist that fail timing constraints and determine replacement routing paths by returning to step 86 via optional path 93. At step 92, the final netlist may be processed further during an assembly process to produce a configuration data file output (e.g., a .pof or .sof file). The configuration data file output may then be loaded onto programmable device 10.

Figure 11:
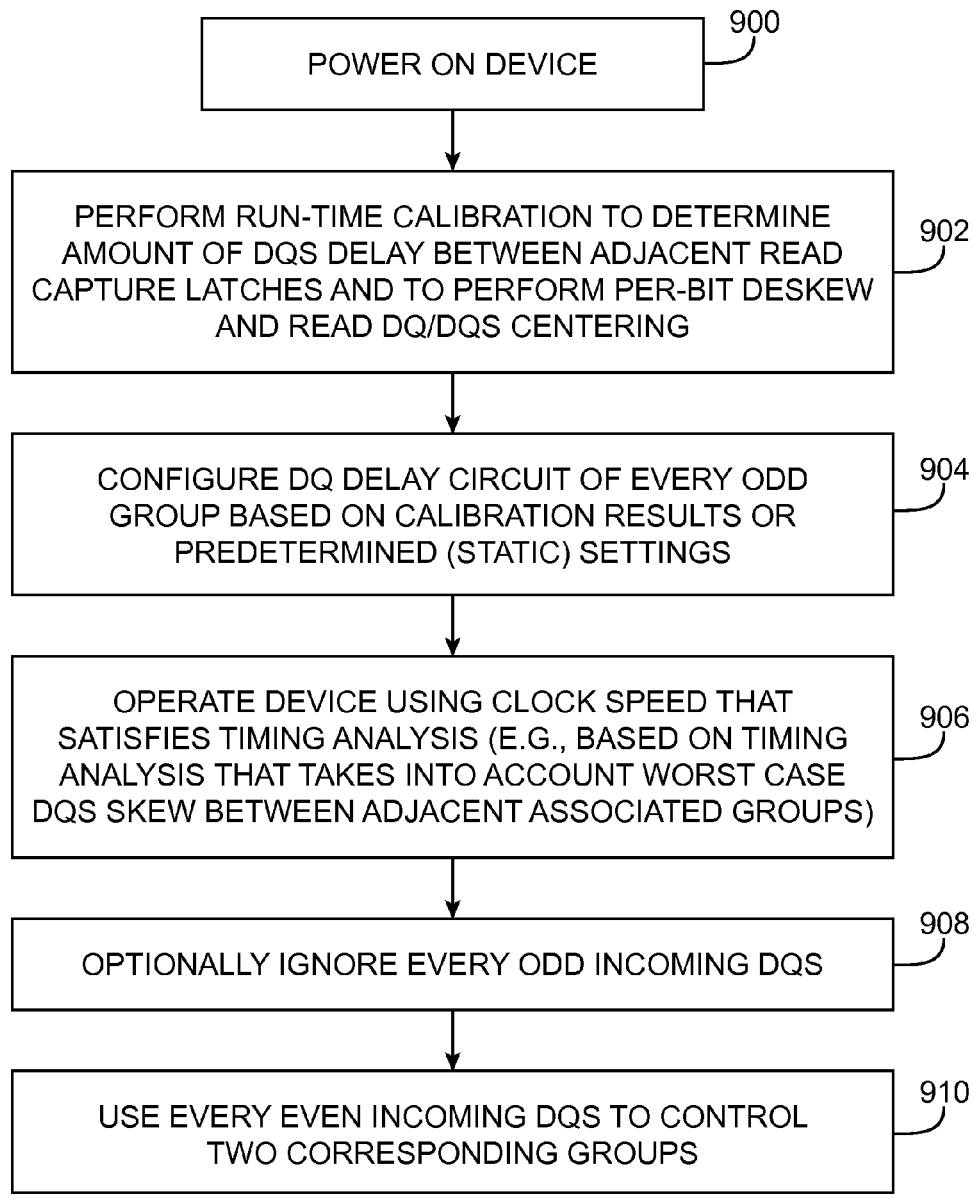
FIG. 11 is a flow chart of illustrative steps for operating memory interface circuitry having data strobe shift and routing circuitry of the type shown in FIG. 6 in accordance with an embodiment of the present invention.

FIG. 11 is a flow chart of illustrative steps for configuring and operating an integrated circuit having memory interface circuitry 24 of the type described in connection with FIG. 6. At step 900, integrated circuit 10 may be powered on.

At step 902, run-time calibration operations may be performed to determine the amount of DQS delay between adjacent read capture latches and to perform per-bit data deskew and read DQ/DQS centering to optimize timing margins. At step 904, the delay circuits (e.g., delay circuits 200, 200', and 202) may be configured based on the calibration results or based on predetermined (or "static") settings. For example, delay circuits 200' may be configured to provide larger delays relative to an associated delay circuit 200.

At step 906, memory interface circuitry 24 may be operated using a clock speed that satisfies design criteria as determined using timing analysis 91 while taking into account the worst case DQS skew between separate data strobe signals.

At step 908, DQS shift and routing circuitry 210 may optionally ignore DQS signals received at every odd-numbered data strobe ports, assuming each data port receives data signals from a respective memory device on memory module 22. The data strobes signals received at the even-numbered ports may be routed to at least two read capture latches for clocking data signals received from at least two corresponding memory devices (step 910). Sharing DQS signals across more than one read capture register may provide substantial area savings for memory interface circuitry 24.

The foregoing is merely illustrative of the principles of this invention and various modifications can be made by those skilled in the art without departing from the scope and spirit of the invention. The foregoing embodiments may be implemented individually or in any combination.

What is claimed is:

1. Memory interface circuitry, comprising:
    a first latching circuit that receives a first group of data signals;
    a second latching circuit that receives a second group of data signals, wherein the first and second latching circuits are controlled using a data strobe signal associated with the second group of data signals;
    a data strobe port through which the data strobe signal associated with the second group of data signals is received; and
    an additional data strobe port through which a data strobe signal associated with the first group of data signals is received.

2. The memory interface circuitry defined in claim 1, further comprising:
    a first data port through which the first group of data signals is received; and
    a second data port through which the second group of data signals is received.

3. The memory interface circuitry defined in claim 2, wherein the first and second data ports receive the first and second group of data signals from a single memory integrated circuit.

4. The memory interface circuitry defined in claim 2, wherein the first data port receives the first group of data signals from a first memory integrated circuit, and wherein the second data port receives the second group of data signals from a second memory integrated circuit.

5. The memory interface circuitry defined in claim 2, further comprising:
    a quarter clock cycle phase shift circuit interposed in a signal path connecting the data strobe port to the first and second latching circuits.

6. The memory interface circuitry defined in claim 2, further comprising:
    a first delay circuit coupled between the first data port and the first latching circuit, wherein the first delay circuit provides a first delay; and
    a second delay circuit coupled between the second data port and the second latching circuit, wherein the second delay circuit provides a second delay that is less than the first delay.

7. An integrated circuit, comprising:
    memory interface circuitry operable in first and second modes, wherein the memory interface circuitry includes at least first and second data ports, wherein:
        during the first mode, the memory interface circuitry receives first data signals from a first memory integrated circuit via the first data port and receives second data signals from a second memory integrated circuit via the second data port; and
        during the second mode, the memory interface circuitry receives data signals from a single memory integrated circuit via the first and second data ports.

8. The integrated circuit defined in claim 7, wherein the memory interface circuitry further includes:
    a first circuit that latches the first data signals; and
    a second circuit that latches the second data signals.

9. The integrated circuit defined in claim 8, wherein the first and second circuits comprise memory read capture registers.

10. The integrated circuit defined in claim 8, wherein the memory interface circuitry further includes
    at least first and second data strobe ports, and wherein the memory interface circuitry ignores a first data strobe signal received from the first memory integrated circuit via the first data strobe port and routes a second data strobe signal received from the second integrated circuit via the second data strobe port to the first and second circuits during the first mode.

11. The integrated circuit defined in claim 8,
    wherein the memory interface circuitry further includes at least first and second data strobe ports, and wherein the memory interface circuitry routes a data strobe signal received from the single memory integrated circuit via a selected one of the first and second data strobe ports to the first and second circuits during the second mode.

12. The integrated circuit defined in claim 8, wherein the memory interface circuitry further includes:
    a first delay circuit coupled between the first data port and the first circuit, wherein the first delay circuit provides a first delay; and
    a second delay circuit coupled between the second data port and the second circuit, wherein the second delay circuit provides a second delay that is less than the first delay.

13. The integrated circuit defined in claim 8, wherein the memory interface circuitry further includes:
- a third data port; and
- a third circuit coupled to the third data port, wherein the memory interface circuitry receives third data signals from a third memory integrated circuit via the third data port during the first mode.

14. The integrated circuit defined in claim 13,
wherein the memory interface circuitry further includes:
- a third circuit that latches the first data signals; and
- at least first, second, and third data strobe ports, wherein the memory interface circuitry ignores a first data strobe signal received from the first memory integrated circuit via the first data strobe port, ignores a second data strobe signal received from the second memory integrated circuit via the second data strobe port, and routes a third data strobe signal received via the third data strobe port from the third memory integrated circuit to each of the first, second, and third circuits during the first mode.

15. A method of operating memory interface circuitry having at least first and second data ports and first and second data strobe ports, the method comprising:
- with a first latching circuit associated with the first data port and the first data strobe port, receiving first data signals via the first data port and receiving a control signal via the second data strobe port; and
- with a second latching circuit associated with the second data port and the second data strobe port, receiving second data signals that are different than the first data signals via the second data port and receiving the control signal via the second data strobe port while the first latching circuit is receiving the first data signals.

16. The method defined in claim 15, further comprising:
receiving the first data signals from a first memory integrated circuit via the first data port;
ignoring an additional control signal received from the first memory integrated circuit via the first data strobe port; and
receiving the second data signals from a second memory integrated circuit via the second data port, wherein receiving the control signal comprises receiving the control signal from the second memory integrated circuit via the second data strobe port and routing the control signal to the first and second latching circuits.

17. The method defined in claim 15, further comprising:
receiving the first data signals from a given memory integrated circuit via the first data port; and
receiving the second data signals from the given memory integrated circuit via the second data port, wherein receiving the control signal comprises receiving the control signal from the given memory integrated circuit via the second data strobe port and routing the control signal to the first and second latching circuits.

18. The method defined in claim 15, further comprising:
performing run-time calibration to obtain a delay value;
with a first circuit coupled between the first data port and the first latching circuit, delaying the first data signals by a first amount of delay; and
with a second circuit coupled between the second data port and the second latching circuit, delaying the second data signals by a second amount of delay, wherein the first amount of delay is greater than the second amount of delay by the obtained delay value.

19. The method defined in claim 15, further comprising:
with a first circuit coupled between the first data port and the first latching circuit, delaying the first data signals by a first amount of delay; and
with a second circuit coupled between the second data port and the second latching circuit, delaying the second data signals by a second amount of delay, wherein the first amount of delay is greater than the second amount of delay by a predetermined value.

* * * * *